United States Patent [19]
Augarten

[11] Patent Number: 5,588,115
[45] Date of Patent: Dec. 24, 1996

[54] REDUNDANCY ANALYZER FOR AUTOMATIC MEMORY TESTER

[75] Inventor: Michael H. Augarten, Newbury Park, Calif.

[73] Assignee: Teradyne, Inc., Boston, Mass.

[21] Appl. No.: 11,003

[22] Filed: Jan. 29, 1993

[51] Int. Cl.[6] .................................................. G06F 11/00
[52] U.S. Cl. ............................. 395/183.05; 395/183.18; 371/21.1; 371/40.1; 364/243.1; 364/245.3; 364/268.3
[58] Field of Search ...................... 395/575, 400, 395/425, 700, 800, 325, 183.05, 183.18; 371/10.3, 21.2, 21.1, 24, 27, 29.1, 40.1, 16.5, 22.6; 364/243, 243.1, 245, 245.3, 268.3

[56] References Cited

U.S. PATENT DOCUMENTS

| Re. 32,388 | 3/1987 | Lockhart, Jr. et al. | 324/73 R |
|---|---|---|---|
| 4,309,657 | 1/1982 | Lockhart, Jr. et al. | 324/73 R |
| 4,389,715 | 6/1983 | Eaton, Jr. et al. | 365/200 |
| 4,414,665 | 11/1983 | Kimura et al. | 371/21.1 |
| 4,450,560 | 5/1984 | Conner | 371/25.1 |
| 4,628,509 | 12/1986 | Kawaguchi | 371/21.1 |
| 4,736,373 | 4/1988 | Scmidt | 371/21.1 |
| 4,752,929 | 6/1988 | Kantz et al. | 371/21.1 |
| 4,876,685 | 10/1989 | Rich | 371/21.6 |
| 5,132,937 | 7/1992 | Tuda et al. | 371/21.2 |
| 5,138,619 | 8/1992 | Fasang et al. | 371/21.1 |
| 5,247,481 | 9/1993 | Conan | 365/200 |
| 5,280,486 | 1/1994 | Arkin et al. | 371/29.1 |
| 5,363,382 | 11/1994 | Tsukakoshi | 371/21.1 |

*Primary Examiner*—Robert W. Beausoliel, Jr.
*Assistant Examiner*—Dieu-Minh Le

[57] ABSTRACT

Memory test apparatus including a redundancy analyzer with a catch RAM transfer interface circuit receiving fault information for a plurality of regions of a memory under test simultaneously in parallel and transmitting the information for each region to a respective one of a plurality of region modules that each has a region input circuit, a region fault RAM, and a microprocessor connected to have access to the region fault RAM, the region fault RAMs storing fault addresses identifying the locations of faults in the memory under test.

28 Claims, 2 Drawing Sheets

REDUNDANCY ANALYZER FOR AUTOMATIC MEMORY TESTER

BACKGROUND OF THE INVENTION

The invention relates to a redundancy analyzer used with an automatic memory tester.

As the density of semiconductor random access memories (RAMs) increases, the probability of defects occurring in them increases as well. One approach to maintaining acceptable production yields is the addition of redundant cells (called spares) that can be used to replace faulty cells. This is most feasible in the case of memory chips due to their uniformity. In such designs, the memory is arranged on the chip in one or more rectangular blocks (called regions). Since errors are most likely to affect bits, rows, or columns, the memory is designed with spare rows and columns of memory cells, along with the associated decoders for each region within the chip.

Automatic circuit testers testing RAMs provide digital test patterns (multi-bit words for both the address and data) at high speed to the address and data pins of a memory under test (MUT). The MUT is then read, and the outputs are compared with the inputs. Failure information is stored in a catch RAM (also referred to as a fail map RAM) having addresses that correspond to the addresses of the MUT.

The failure information stored in the catch RAM is typically transferred to a fault RAM in a redundancy analyzer that stores all of the information in the catch RAM, and the redundancy analyzer then analyzes how to connect redundant (spare) memory elements in the MUT in place of faulty elements in the MUT. Repair equipment then disconnects the faulty elements, and redundant elements are programmed to replace them.

SUMMARY OF THE INVENTION

In one aspect, the invention features, in general, memory test apparatus for analyzing fault information for a memory under test (MUT). Fault information is received simultaneously for a plurality of regions of the MUT in parallel and provided to respective region modules that receive and process fault information for a respective region of the MUT. Each region module includes a region input circuit for receiving the fault information, a region fault RAM for storing the region fault information, and a microprocessor having access to the region fault RAM. In this way, fault information for different regions of the memory under test can be inputted simultaneously and thereafter analyzed simultaneously in respective region modules.

In preferred embodiments, the fault information is stored in a catch random access memory (RAM), and a catch RAM transfer interface circuit connects fault information lines from the catch RAM to the region modules. The catch RAM transfer interface circuit includes multiplexers permitting selection of one of a plurality of input lines to be connected to a particular region module. The catch RAM transfer interface circuit outputs a transfer clock to all region modules. The region input circuit is a logic array. The region modules each include respective program RAM. A data bus interface circuit connects a host computer to all region modules, the host computer having access to the program RAMs and the fault RAMs via the region input circuits.

In another aspect, the invention features, in general, memory test apparatus that includes a fault input means that receives fault information for an MUT and generates MUT fault address data identifying locations of faults in the MUT, a fault RAM that stores the MUT fault address data for the faults, and a microprocessor for analyzing the MUT fault address data. The memory space needed for a fault RAM thus is greatly reduced by storing only address information for those memory elements having faults.

In preferred embodiments, an error counter circuit generates fault RAM addresses for storing MUT fault address data in the fault RAM. A data counter circuit generates MUT fault address data stored in the fault RAM by counting transfer clock pulses that are synchronous with the fault information. An error detector detects errors in the fault information and enables the error counter circuit to count transfer clock pulses corresponding to errors in the fault information. A cycle counter circuit counts the transfer clock pulses and provides an enable signal to the data counter circuit when the counted transfer clock pulses exceed a start count and discontinues the enable signal when the counted transfer pulses exceed a stop count. The cycle counter circuit receives an ignore serial error (ISE) input, and does not output the enable signal when disabled by the ISE input. The error counter circuit also is only enabled after the start count and before the stop count. RAM write logic outputs a chip enable signal to the fault RAM enabling the fault RAM to store a new MUT fault address datum output by the data counter circuit at a new fault RAM address output by the error counter circuit subsequent to both counter circuits being incremented by a transfer clock pulse. Delay circuits are used to provide delayed transfer clock pulses counted by the counter circuits and double-delayed transfer clock pulses used by the RAM write logic.

Other advantages and features of the invention will be apparent from the following description of a preferred embodiment thereof and from the claims.

DESCRIPTION OF THE PREFERRED EMBODIMENT

The drawings will be described first.

DRAWINGS

STRUCTURE

Figure 1:
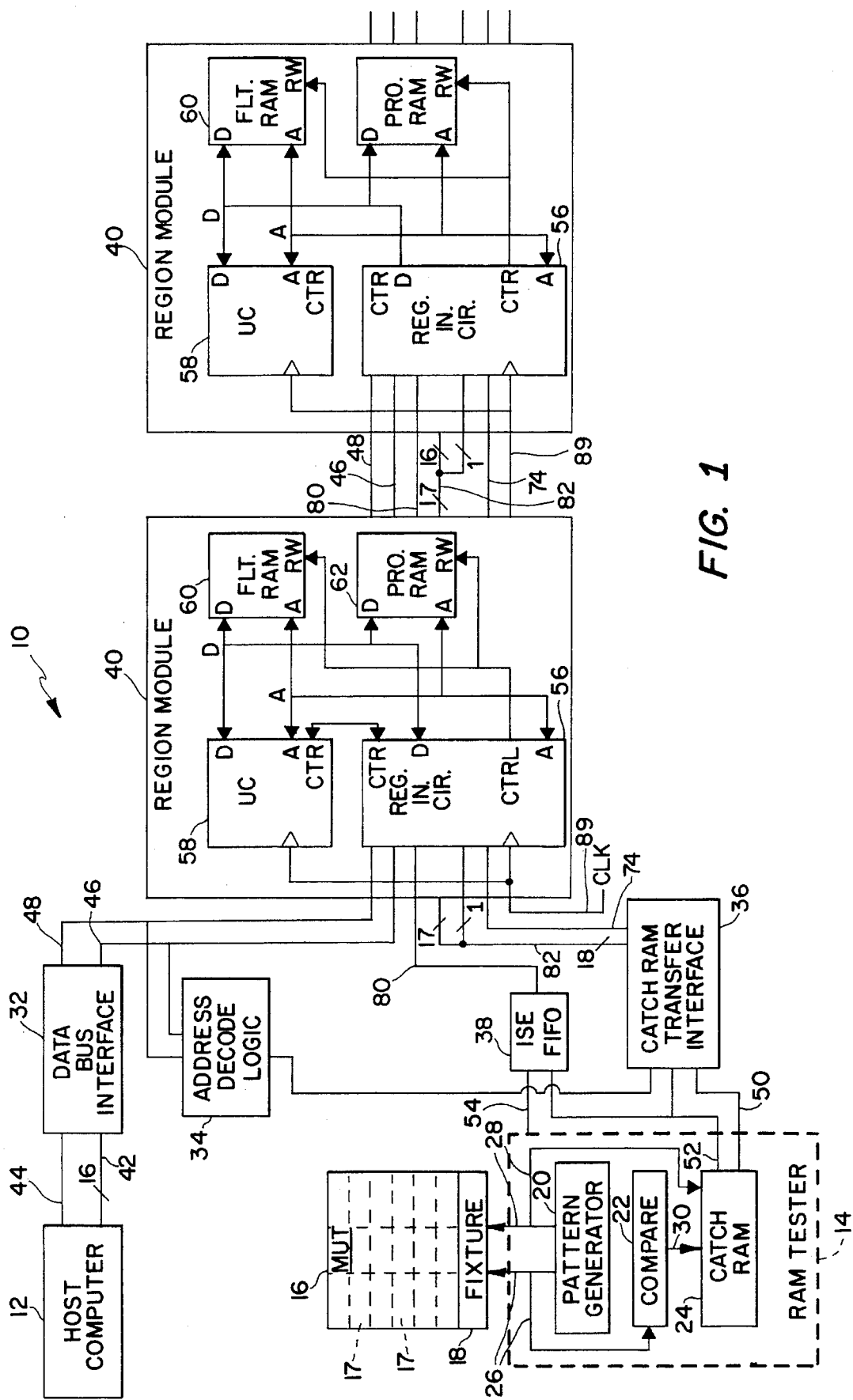
FIG. 1 is a block diagram showing a redundancy analyzer according to the invention connected to a host computer and memory tester.

Referring to FIG. 1, there is shown redundancy analyzer 10 connected to host computer 12 (available from Sun Microsystems under the SUN4 trade designation) and memory tester 14, in turn connected to memory under test (MUT) 16 via fixture 18.

Memory tester 14 includes high speed pattern generator 20, compare circuit 22, and catch RAM 24. Pattern generator 20 generates multi-bit data outputs over lines 26 and addresses over lines 28 to memory under test 16. Pattern generator 20 also outputs data over lines 26 to multi-bit comparator 22 and addresses over lines 28 to catch RAM 24 for use when the data stored in MUT 16 are read from MUT 16 and compared at comparator 22, which generates failure information on a bit-by-bit basis that is provided over lines 30 and stored in catch RAM 24.

Redundancy analyzer 10 includes a data bus interface circuit 32, address decode logic 34, catch RAM transfer interface circuit 36, ignore serial error (ISE) first-in-first-out (FIFO) circuit 38, and up to eighteen region modules 40. Two region modules 40 are shown on FIG. 1. MUT 16 has a plurality of regions 17 (eighteen are shown on FIG. 1), and each region module 40 is associated with a respective region 17 (or regions 17, as described below) on MUT 16.

Data bus interface circuit 32 is connected to host computer 12 via data lines 42 and control lines 44. It buffers the data and control signals. Output data lines 46 and control lines 48 connect data bus interface circuit 32 to both address decode logic 34 and all region modules 40.

Address decode logic 34 has logic circuits to decode inputs over lines 46 and 48 and generate outputs to control multiplexers and other components in catch RAM transfer interface circuit 36.

Catch RAM transfer interface circuit 36 is connected to receive fault information from catch RAM 24 over parallel fault information lines 50 from catch RAM 24 and a clock signal from catch RAM 24 over clock line 52 to clock in fault information on lines 50. Each line 50 is connected to an input/output data node of catch RAM 24 and corresponds to an input/output pin of MUT 16. Catch RAM interface circuit 36 includes a plurality of series of multiplexers connected to the inputs from fault information lines 50 to be combined together (by an OR function) so that fault information from more than one region 17 on MUT 16 can be stored in a single region module 40. Catch RAM interface circuit 36 has eighteen region fault lines 82 distributed to respective region modules 40, and a transfer clock line 74 distributed to all region modules 40. On FIG. 1, one of the eighteen lines 82 is shown connected to the left-hand region module 40, and the other seventeen lines 82 are shown continuing on to the other region modules 40; one of these seventeen lines 82 is shown connected to the right-hand region module 40, and sixteen lines 82 are shown continuing on for connection to the other region modules 40, which are not shown on FIG. 1.

ISE FIFO 38 receives an ISE input over line 54 from memory tester 14. The ISE signal is used so that redundancy analyzer 10 can ignore any data on fault information lines 50 when the signal is asserted. The ISE signal on line 54 is clocked in with a local clock, and pipelining is accomplished with a FIFO buffer so that the ISE signal output on line 80 is in the proper cycle with fault information on lines 82 and is synchronized with the clock from catch RAM 24 on line 52.

Data bus interface circuit 32, catch RAM transfer interface circuit 36 and ISE FIFO circuit 38 convert the ECL inputs received by them to TTL signal outputs used by components in region modules 40.

Each region module 40 is connected to its respective, single region fault information line 82 and is connected to common transfer clock line 74, ISE line 80, host data and control lines 46, 48 and master clock line 89, all of which are also connected to the other region modules 40. Each region module 40 includes region input circuit 56, microprocessor 58, 256K×24 fault RAM 60 and 128K×16 program RAM 62. Region input circuit 56 is implemented by a 132-pin quad flat pack CMOS array and is responsible for providing access to the fault and program RAMs 60, 62 by host computer 12, microprocessor 58, and catch RAM 24. Microprocessor 58 is a 68 ECO-030 microcontroller. The RAMs used in fault RAM 60 and program RAM 62 are static CMOS RAMs.

Figure 2:
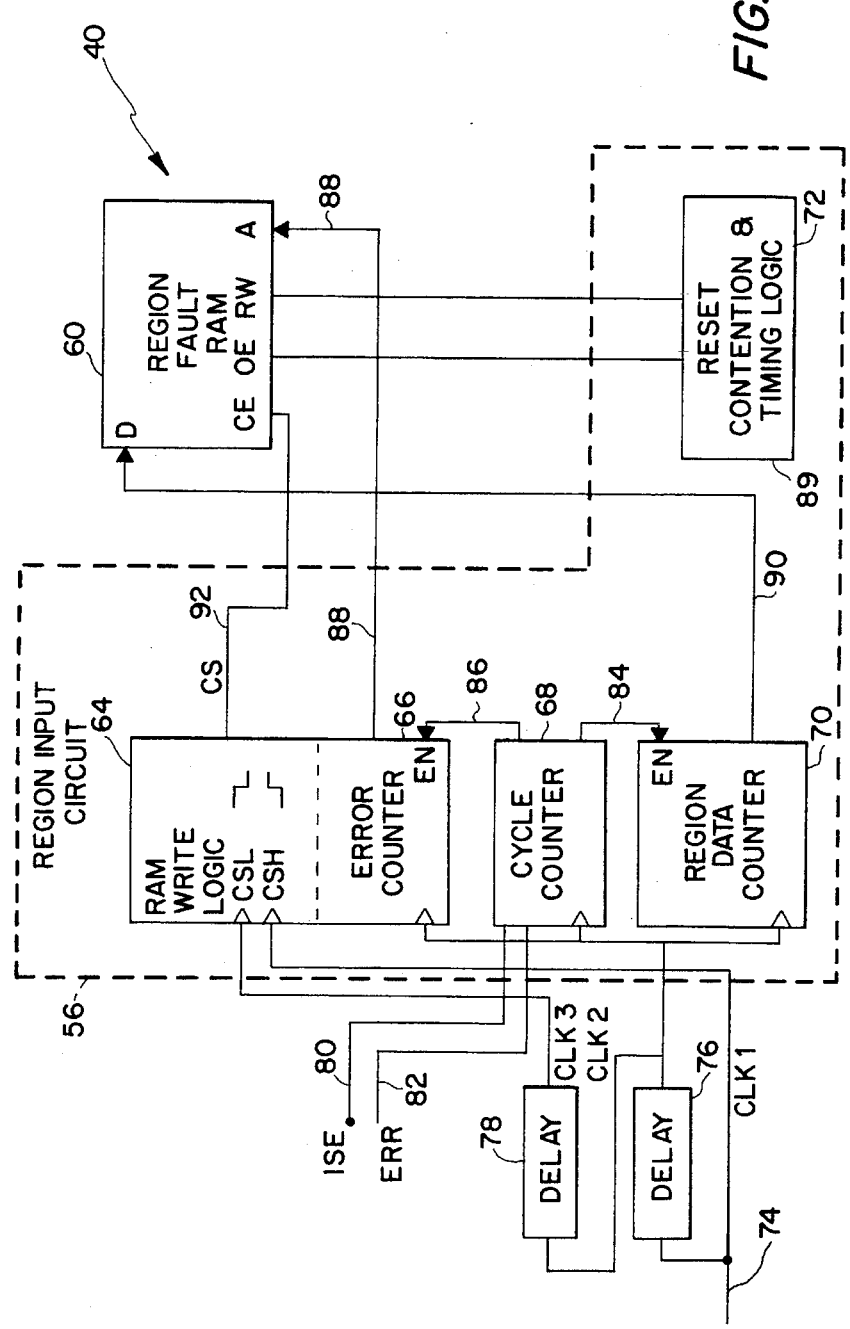
FIG. 2 is a block diagram showing some components of the FIG. 1 redundancy analyzer.

FIG. 2 shows the components in region input circuit 56 employed during access by catch RAM 24. These include RAM write logic 64, error counter circuit 66, cycle counter circuit 68, region data counter circuit 70, and reset contention and timing logic 72. First and second delay circuits 76, 78 are implemented outside of the CMOS array of region input circuit 56. Transfer clock line 74 is directly connected to RAM write logic 64 and to first delay circuit 76. The output of first delay circuit 76 is connected to the clock inputs for counter circuits 66, 68, 70 and to second delay circuit 78. The output of second delay circuit 78 is provided to RAM write logic 64.

Cycle counter circuit 68 receives the ISE input over line 80 and fault information for the region over line 82 and outputs enable signals over first enable line 84 to region data counter circuit 70 and over second enable line 86 to error counter circuit 66. Circuit 68 includes a counter that counts delayed transfer clock pulses from delay circuit 76 when enabled by a low ISE signal. It also includes logic that determines when the counted clock pulses exceed a start count and have not exceeded a stop count; if this condition is met, the first enable signal is continuously outputted on line 84, and the fault information input on line 82 is outputted, via logic, as the second enable signal on line 86.

Error counter circuit 66 includes a counter that counts delayed transfer clock pulses from delay circuit 76 when enabled by the second enable signal on line 86. Because error counter circuit 66 is only enabled by the second enable signal when an error has been detected in the fault information, it effectively counts errors. Its count output is provided over line 88 as fault RAM addresses to address fault RAM 60.

Region data counter circuit 70 includes a counter that counts delayed transfer clock pulses from delay circuit 76 when enabled by the first enable signal on line 84. Its count output is an MUT fault address datum identifying the location of the memory element in the associated region 17 corresponding to the fault information on line 82 synchronous with the transfer clock pulse just counted. The MUT fault address data are provided over line 90 to the data input to fault RAM 60.

RAM write logic 64 outputs a control signal, CS, on line 92 to the chip enable input to fault RAM 60. The undelayed clock pulse input to RAM write logic causes CS to go high; the double-delayed transfer clock pulse from delay circuit 78 causes CS to go low if error counter circuit 66 has been enabled to count a transfer clock pulse and update the fault RAM address. CS high disables fault RAM 60, preventing it from writing data; when CS goes low, data are written into fault RAM 60.

Reset contention and timing logic 72 provides outputs to control the output enable and read/write inputs to fault RAM 60. During access by catch RAM 24, static signals are provided to disable the output of fault RAM 60 and maintain fault RAM 60 in the write mode.

OPERATION

Digital test patterns generated at pattern generator 20 are provided over data lines 26 and address lines 28 at high speed to the address and data pins of MUT 16. MUT 16 is then read by providing addresses over lines 28, and the outputs (multi-bit words) are compared bit-by-bit with the data that had been input to MUT 16 and are repeated over lines 26 to multi-bit comparator 22. Failure information is stored in catch RAM 24 at addresses that correspond to the addresses of MUT 16 and are provided by pattern generator over lines 28 to catch RAM 24. The failure information for a memory element is a high bit if the bit read from the memory element differs from the bit that had been written into it.

Catch RAM 24 is addressed to read the bits from eighteen memory elements in different regions 17 simultaneously and to provide the data over respective lines 50 synchronously with clock pulses over line 52. Depending upon the routing through the multiplexers in catch RAM transfer interface circuit 36, the failure information from a particular region 17 on a respective line 50 is transmitted on a particular line 82 to a particular region module 40. In the simplest case, all fault information for a particular region 17 would appear on the same line 50, and there would be eighteen, or fewer, regions 17; in this case, fault information could be read for all regions 17 simultaneously, and all of the information in a region module 40 would come from a single region 17 on MUT 16. If fault information for a region 17 appears on more than one line 50, the lines 50 would be activated one at a time at catch RAM 24, and their outputs would be combined by OR gates in catch RAM transfer interface circuit 36; data from different lines 50 would thus be read in different cycles and combined into one fault RAM 60. In this case, fault information for different regions 17 can still be read simultaneously over the other lines 50. If more than one region is to be stored in a region module 40 (e.g. if there are more than eighteen regions), the memory space in fault RAM 60 would be partitioned, and fault information from one region would be inputted first, and fault information from another region would then be inputted.

Catch RAM transfer interface circuit 36 outputs failure information on lines 82 (high if error, low if not), synchronously with transfer clock pulses on line 74. Because the memory elements in region 17 were addressed in known order, and the corresponding memory elements in catch RAM 24 were addressed in known order, the memory element location in region 17 for the failure information appearing on line 82 at a given time can be determined by the count of transfer clock pulses on line 74. Thus, the count output of region data counter circuit 70 indicates the address in region 17 for the fault information appearing on line 82.

ISE is asserted by memory tester 14 on line 54 to redundancy analyzer 10 to ignore the data appearing on lines 50 from it and passed through on lines 82. The ISE signal is synchronized with the failure information at ISE FIFO circuit 38 and provided over line 80 to cycle counter circuit 68, which in turn disables the counters in circuits 66, 68, and 70. Also, the transfer clock pulses on line 74 are counted by the counter (after delay at delay circuit 76) in cycle counter circuit 68 and compared with start and stop counts, so that region data counter circuit 70 and error counter circuit 66 only count valid transfer clock pulses between the start and stop counts.

Figure 3:
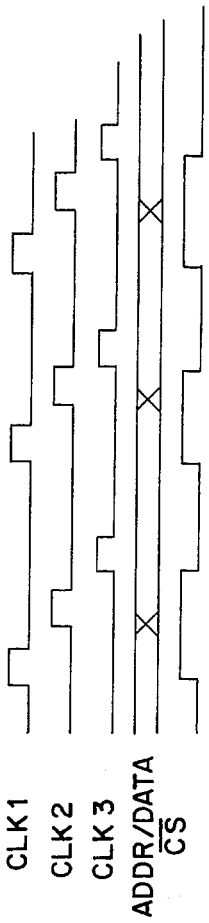
FIG. 3 is a timing diagram relating to generating and writing MUT fault address data stored in a fault RAM of the FIG. 1 redundancy analyzer.

Referring to FIGS. 2 and 3, the transfer clock pulses on line 74 are delayed twice to provide three clock pulses (CLK1, CLK2, and CLK3) to synchronize the writing into fault RAM 60 with the incrementing of the counters in circuits 66 and 70 and the resulting changes of the fault RAM addresses and MUT fault address data appearing at the address and data inputs to fault RAM 60. CLK1 is the undelayed transfer clock pulse on line 74; it causes RAM write logic 64 to cause CS to go high and disable fault RAM 60 from writing. CLK2 is the once-delayed transfer clock pulse output by delay circuit 76 and counted by the counters in all three circuits 66, 68, 70; the fault RAM address output by error counter circuit 66 and the MUT fault address datum output by region data counter circuit 70 are thus incremented upon a rising edge of CLK2. (The fault RAM address will not be incremented if circuit 66 is not enabled by detection of error data by circuit 68; the MUT address datum will be incremented whether or not an error has been detected.) CLK3 is the twice-delayed transfer clock pulse output by delay circuit 78; it causes RAM write logic 64 to cause CS to go low and enable fault RAM 60 to write the MUT fault address datum appearing at its data input at the fault RAM address appearing at its address input, provided that error counter circuit 66 has just been enabled to count a transfer clock pulse and increment the fault RAM address.

After all of the failure information has been stored in the fault RAMs, the individual microprocessors 58 in the region modules analyze the faulty memory elements in the regions 17 and determine how to connect redundant (spare) memory elements in region 17 in place of faulty elements. Because up to eighteen regions are analyzed simultaneously, the time for analysis is reduced. Also, microprocessors 58 can be analyzing the fault information for one MUT, while the next MUT is being tested at memory tester 14, and fault information are being stored in catch RAM 24. Repair equipment then disconnects the faulty elements and redundant elements are programmed to replace them.

All random access memory in region modules 40 can be accessed by host computer 12; redundancy programs can be downloaded to program RAM 62, and both fault RAM 60 and program RAM 62 can be read and written for status and diagnostic purposes.

OTHER EMBODIMENTS

Other embodiments of the invention are within the scope of the following claims. The fault information could be outputted from multi-bit comparator 22 to catch RAM transfer interface circuit 36 without intermediate storage in catch RAM 24.

What is claimed is:

1. Memory test apparatus for testing a memory under test (MUT) formed from physical structures which define a plurality of storage locations organized into a plurality of regions, said apparatus comprising:
   a) means for testing the plurality of storage locations in the MUT and generating fault signals indicating which of the plurality of storage locations in the MUT is faulty,
   b) a plurality of region modules, each said module having an input, and each said region module comprising:
      i) a region fault RAM storing data,
      ii) analysis means, connected to said region fault RAM, for analyzing the data in the region fault RAM to identify faulty structures within the MUT, and
      iii) input means, coupled to the input of the region module and the region fault RAM, for storing information from the input to the region fault RAM, and
   c) interface means, having an input connected to the means for testing and a plurality of outputs, each output coupled to a region module, for routing fault signals indicating a faulty location to the input of a region module which is selected based on the region of the MUT which contains the faulty location.

2. The memory test apparatus of claim 1 wherein said interface means includes OR gates to combine fault signals indicating faulty storage locations in more than one region in the MUT.

3. The memory test apparatus of claim 1 wherein said interface means includes multiplexers.

4. The memory test apparatus of claim 1 wherein said interface means includes a transfer clock and the transfer clock is connected to all said region modules.

5. The memory test apparatus of claim 1 wherein the means for testing comprises a catch RAM having data output nodes coupled to the fault signals.

6. The memory test apparatus of claim 1 wherein said means for testing comprises a comparator having an output coupled to the fault signals.

7. The memory test apparatus of claim 1 wherein said input means is a logic array.

8. The memory test apparatus of claim 1 wherein the analysis means in each said region module includes a microprocessor and program RAM connected to the microprocessor.

9. The memory test apparatus of claim 8 further comprising;
   a) a host computer; and
   b) a data bus interface means for connecting the host computer to all said region modules to access said program RAM and said fault RAM.

10. The memory test apparatus of claim 1 wherein each said input means comprises means for generating MUT fault address data identifying the locations of faults in said MUT, and wherein said region fault RAM is connected to store said MUT fault address data.

11. The memory test apparatus of claim 10 wherein said means for generating fault address data includes an error counter circuit that generates fault RAM addresses for storing said MUT fault address data in said fault RAM by counting errors in said fault information.

12. The memory test apparatus of claim 11 wherein said means for generating fault address data includes a data counter circuit that generates said MUT fault address data stored in said fault RAM by counting transfer clock pulses that are synchronous with said fault information.

13. The memory test apparatus of claim 12 wherein said means for generating fault address data includes an error detector that detects errors in said fault information and enables said error counter circuit to count transfer clock pulses corresponding to errors in said fault information.

14. A memory test apparatus for analyzing fault information for a memory under test (MUT), said apparatus comprising;
   a) a computer work station,
   b) means, connected to the computer work station and operating in response to commands from the computer work station, for generating fault information from said memory under test,
   c) a capture RAM connected to the means for generating fault information,
   d) at least one fault RAM connected to said capture RAM,
   e) means for transferring data from the capture RAM to the fault RAM, and
   f) microprocessor means, connected to have access to said fault RAM, for analyzing said MUT fault.

15. The memory test apparatus of claim 14 wherein said means for transferring data includes an error counter circuit that generates fault RAM addresses for storing said MUT fault address data in said fault RAM by counting errors in said fault information.

16. The memory test apparatus of claim 15 wherein said means for transferring data includes a data counter circuit that generates said MUT fault address data stored in said fault RAM by counting transfer clock pulses that are synchronous with said fault information.

17. The memory test apparatus of claim 16 wherein said means for transferring data includes an error detector that detects errors in said fault information and enables said error counter circuit to count transfer clock pulses corresponding to errors in said fault information.

18. The memory test apparatus of claim 17 wherein said means for transferring data includes a cycle counter circuit that counts said transfer clock pulses and provides a first enable signal to said data counter circuit when the counted transfer clock pulses exceed a start count.

19. The memory test apparatus of claim 18 wherein said first enable signal is discontinued when the counted transfer clock pulses exceed a stop count.

20. The memory test apparatus of claim 19 wherein said cycle counter circuit includes an ignore serial error (ISE) input, and said cycle counter circuit does not output said first enable signal when disabled by said ISE input.

21. The memory test apparatus of claim 18 wherein said cycle counter circuit includes said error detector and provides a second enable signal to said error counter circuit when the counted transfer clock pulses exceed a start count and an error has been detected in said fault information, said error counter circuit counting said transfer clock pulses when enabled by said second enable signal.

22. The memory test apparatus of claim 21 wherein said second enable signal is discontinued when the counted transfer clock pulses exceed a stop count.

23. The memory test apparatus of claim 17 wherein said fault input means includes RAM write logic that outputs a chip enable signal to said fault RAM, said chip enable signal enabling said fault RAM to store a new MUT fault address datum output by said data counter circuit at a new fault RAM address output by said error counter subsequent to both said counter circuits being incremented by a transfer clock pulse.

24. The memory test apparatus of claim 23 further comprising a first delay circuit that provides a delayed transfer clock pulse to said RAM write logic, said delayed transfer clock pulse causing said chip enable signal to enable said fault RAM to write.

25. The memory test apparatus of claim 24 wherein said RAM write logic causes said chip enable signal to disable said fault RAM prior to counting of a transfer clock pulse by said data counter and said error counter.

26. The memory test apparatus of claim 25 further comprising a second delay circuit that delays transfer clock pulses counted by said data counter circuit and said error counter circuit, and wherein said first delay circuit delays the delayed transfer clock pulses output by said another delay circuit.

27. The memory test apparatus of claim 26 wherein undelayed transfer clock pulses cause said RAM write logic to disable said fault RAM.

28. The memory test apparatus of claim 15 wherein said means for transferring data comprises means for transferring the address of faulty locations in the MUT to the fault RAM.

* * * * *